United States Patent
Hosono et al.

(10) Patent No.: US 9,774,295 B2
(45) Date of Patent: Sep. 26, 2017

(54) PHOTOELECTRIC CONVERSION ELEMENT AND PHOTOVOLTAIC CELL

(71) Applicant: SEIKO EPSON CORPORATION, Tokyo (JP)

(72) Inventors: Satoru Hosono, Azumino (JP); Satoshi Kimura, Fujimi-machi (JP); Setsuya Iwashita, Nirasaki (JP); Yasuaki Hamada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 418 days.

(21) Appl. No.: 14/223,332

(22) Filed: Mar. 24, 2014

(65) Prior Publication Data
US 2014/0290734 A1  Oct. 2, 2014

(30) Foreign Application Priority Data
Mar. 28, 2013  (JP) .................. 2013-067943

(51) Int. Cl.
*H01L 31/00* (2006.01)
*H02S 99/00* (2014.01)
*H01L 49/00* (2006.01)

(52) U.S. Cl.
CPC .............. *H02S 99/00* (2013.01); *H01L 49/00* (2013.01)

(58) Field of Classification Search
CPC ... H01L 27/20; H01L 31/0264; H01L 41/047; H02S 99/00; G01J 1/42
USPC ................................. 136/252–265
See application file for complete search history.

(56) References Cited

U.S. PATENT DOCUMENTS

| 4,365,106 A * | 12/1982 | Pulvari ........... H01L 37/02 136/206 |
| 4,927,721 A | 5/1990 | Gratzel et al. |
| 7,018,853 B1 * | 3/2006 | Li ............... B82Y 10/00 257/295 |
| 2006/0213549 A1 * | 9/2006 | Yao ............... H01L 31/0264 136/252 |

FOREIGN PATENT DOCUMENTS

| JP | 01-220380 | 9/1989 |
| JP | 2009-065216 | 3/2009 |

OTHER PUBLICATIONS

Farhan, Mansour S., Erfan Zalnezhad, Abdul Razak Bushroa, and Ahmed Aly Diaa Sarhan. "Electrical and Optical Properties of Indium-tin Oxide (ITO) Films by Ion-assisted Deposition (IAD) at Room Temperature." International Journal of Precision Engineering and Manufacturing Int. J. Precis. Eng. Manuf. 14.8 (2013): 1465-469.*

(Continued)

*Primary Examiner* — Keith Hendricks
*Assistant Examiner* — Kourtney S Carlson
(74) *Attorney, Agent, or Firm* — Workman Nydegger (57) ABSTRACT

A photoelectric conversion element includes a ferroelectric layer; a first electrode and a second electrode provided on a surface or a surface layer portion of the ferroelectric layer; a common electrode provided on a surface or a surface layer portion of an opposite side to a side of the ferroelectric layer on which the first electrode and the second electrode are provided; and a pair of lead-out electrodes extracting electric power from the ferroelectric layer, in which the first electrode and the second electrode are arranged alternately in a predetermined direction.

11 Claims, 5 Drawing Sheets

(56) References Cited

OTHER PUBLICATIONS

Mandal, Dipankar, K. Henkel, K. Müller, and D. Schmeißer. "Bandgap Determination of P(VDF-TrFE) Copolymer Film by Electron Energy Loss Spectroscopy." Bulletin of Materials Science Bull Mater Sci 33.4 (2010): 457-61.*

Qin, Meng, Kui Yao, Yung C. Liang, and Bee Keen Gan. "Stability of Photovoltage and Trap of Light-induced Charges in Ferroelectric $WO_3$-doped $(Pb_{0.97}La_{0.03})(Zr_{0.52}Ti_{0.48})O_3$ Thin Films." Appl. Phys. Lett. Applied Physics Letters 91.9 (2007): 092904.*

Vella, Eleonora, Fabrizio Messina, Marco Cannas, and Roberto Boscaino. "Unraveling Exciton Dynamics in Amorphous Silicon Dioxide: Interpretation of the Optical Features from 8 to 11 EV." Phys. Rev. B Physical Review B 83.17 (2011).*

S.Y. Yang, J.Seidel, S.J.Byrnes, P.Shafer, C.-H.Yang, M.D.Rossell, P.Yu, Y.-H.Chu, J.F.Scott, J.W.Ager, III, L.W.Martin, and R.Ramesh: Nature Nanotechnology, vol. 5(2010) pp. 143-147.

\* cited by examiner

PHOTOELECTRIC CONVERSION ELEMENT AND PHOTOVOLTAIC CELL

BACKGROUND

1. Technical Field

The present invention relates to a photoelectric conversion element using an oxide semiconductor, and a photovoltaic cell.

2. Related Art

According to the related art, a photovoltaic cell (photoelectric conversion element) using silicon has gathered attention as an environmentally friendly power source. The photovoltaic cell using silicon is formed by a PN junction on a single crystal or polycrystalline silicon substrate (refer to JP-A-1-220380).

However, such a photovoltaic cell has high manufacturing costs, and further a high degree of control over the manufacturing conditions is necessary. Furthermore, a large amount of energy is necessary in manufacturing, and it cannot be said that the power source necessarily saves energy.

Dye-sensitized solar batteries which have low manufacturing costs, and further, use little manufacturing energy are being developed as next generation solar batteries that replace the current solar batteries. However, because an electrolyte with high vapor pressure is used in the dye-sensitized photovoltaic cell, there is a problem with the electrolyte volatilizing.

Furthermore, as a photovoltaic cell of a recent and newly developed method, there is a method in which a domain structure of a ferroelectric material is used (for example, refer to S. Y. Yang, J. Seidel, S. J. Byrnes, P. Shafer, C.-H. Yang, M. D. Rossell, P. Yu, Y.-H. Chu, J. F. Scott, J. W. Ager, III, L. W. Martin, and R. Ramesh: Nature Nanotechnology 5 (2010) p. 143).

However, S. Y. Yang, J. Seidel, S. J. Byrnes, P. Shafer, C.-H. Yang, M. D. Rossell, P. Yu, Y.-H. Chu, J. F. Scott, J. W. Ager, III, L. W. Martin, and R. Ramesh: Nature Nanotechnology 5 (2010) p. 143 reports that when a single crystal ferroelectric has a domain structure, electricity is generated through light irradiation, and the prospects for practical usage are a completely unknown quantity.

SUMMARY

An advantage of some aspects of the invention is to provide a novel photoelectric conversion element and a photovoltaic cell.

According to an aspect of the invention, there is provided a photoelectric conversion element including a ferroelectric layer formed from a ferroelectric material; a first electrode and a second electrode provided on a surface or a surface layer portion of the ferroelectric layer; a common electrode provided on a surface or a surface layer portion of an opposite side to a side of the ferroelectric layer on which the first electrode and the second electrode are provided; and a pair of lead-out electrodes extracting electric power from the ferroelectric layer, in which the first electrode and the second electrode are arranged alternately in a predetermined direction.

According to the aspect, when a voltage is applied between the first electrode and the common electrode, and between the second electrode and the common electrode, alternately differing polarization is generated in a region between the first electrode and the second electrode and the common electrode of the ferroelectric layer, a domain structure is formed by a wall portion being formed between regions having different polarizations that are the region facing the region between the first electrode and the second electrode, and, in so doing, electric power due to light irradiation can be extracted from between lead-out electrodes.

Here, it is preferable that the first electrode and the second electrode be interdigitated array electrodes or spiral electrodes. Thereby, the first electrode and the second electrode can be efficiently arranged with high density, and a domain structure can be efficiently formed.

It is preferable that the lead-out electrodes be arranged on the outside of the region in which the first electrode and the second electrode are provided. Thereby, electric power generated by the domain structure can be efficiently extracted from the lead-out electrodes.

It is preferable that at least one of the first electrode and the second electrode, and the common electrode have a larger band gap than the ferroelectric layer. In so doing, light can be efficiently incorporated into the ferroelectric layer.

It is preferable that the ferroelectric layer be formed on a base. In so doing, a ferroelectric layer can be simply and efficiently formed.

It is preferable that the entire base or a surface thereof serve as the common electrode by having conductivity, the ferroelectric layer be formed on the base, and the first electrode and the second electrode be formed on the upper surface of the ferroelectric layer. In so doing, the first electrode and the second electrode, and the ferroelectric layer and the common electrode can be simply and efficiently formed.

It is preferable that the common electrode be formed on the base, the ferroelectric layer be formed on the common electrode, and the first electrode and the second electrode be formed on the upper surface of the ferroelectric layer. In so doing, the first electrode and the second electrode, and the ferroelectric layer and the common electrode can be simply and efficiently formed.

It is preferable that at least one of the first electrode and the second electrode, the base, and the common electrode have a larger band gap than the ferroelectric layer. In so doing, light can be efficiently incorporated into the ferroelectric layer.

It is preferable that the first electrode and the second electrode be formed on the base, the ferroelectric layer be formed on the base, the first electrode, and the second electrode, and the common electrode be formed on the ferroelectric layer. In so doing, the first electrode and the second electrode, and the ferroelectric layer and the common electrode can be simply and efficiently formed.

It is preferable that at least one of the first electrode and the second electrode, and the common electrode have a larger band gap than the ferroelectric layer. In so doing, light can be efficiently incorporated into the ferroelectric layer.

According to another aspect of the invention, there is provided a photovoltaic cell using the photoelectric conversion element. According to the aspect, since a photoelectric conversion element that performs photoelectric conversion due to the domain structure is included, it is possible to comparatively simply realize a highly reproducible and low cost photovoltaic cell.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, embodiments of the present invention are described in detail based on drawings. The embodiments show one form of the invention, and arbitrary modifications are possible within the scope of the invention without limiting the invention to the embodiments.

Embodiment 1

Figure 1:
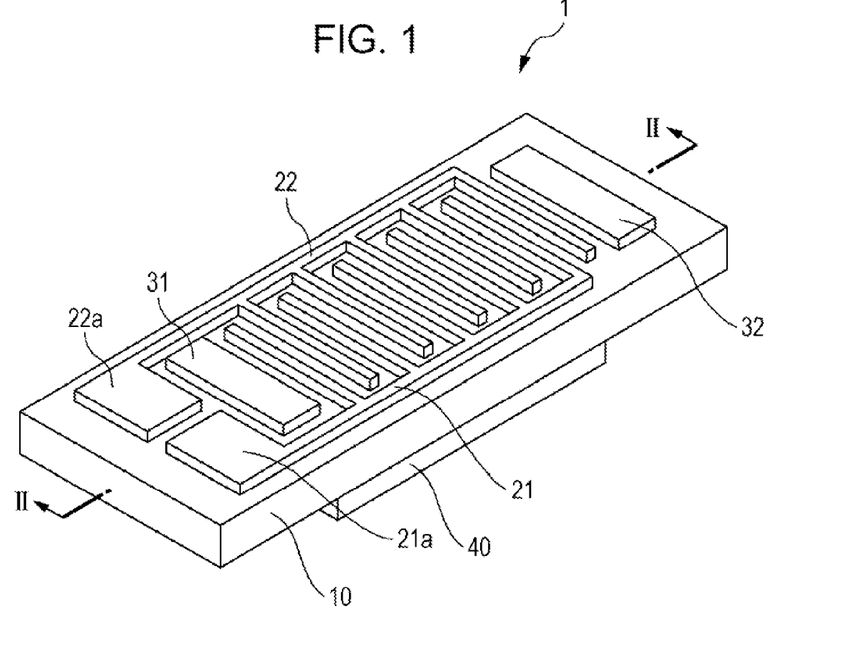
FIG. 1 is a diagram showing a schematic configuration of a photoelectric conversion element according to Embodiment 1 of the invention.
Figure 2:
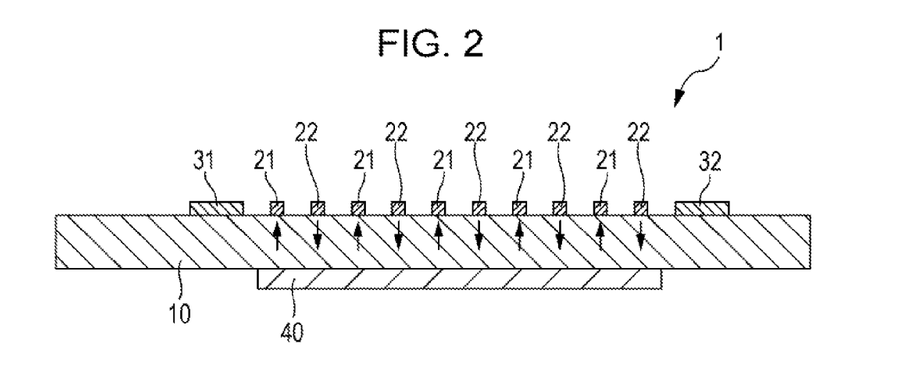
FIG. 2 is a cross-sectional view taken along the line II-II of FIG. 1.

FIG. 1 is a diagram showing the schematic configuration of a photoelectric conversion element (photovoltaic cell) according to Embodiment 1 of the invention, and FIG. 2 is a cross-sectional view taken along line II-II in FIG. 1.

As shown in FIG. 1, the photoelectric conversion element 1 is provided by opposing a pair of a first electrode 21 and a second electrode 22 on a ferroelectric layer 10 formed in a plate shape. The first electrode 21 and the second electrode 22 according to Embodiment 1 of the present invention are a combined pair of interdigitated array electrodes, and the comb tooth part of each of the first electrode 21 and the second electrode 22 are alternately arranged with a predetermined gap in one direction (a direction orthogonal to the direction in which the comb teeth extend). Terminal portions 21a and 22a for applying a voltage are provided at one end in one direction of the first electrode 21 and the second electrode 22. Lead-out electrodes 31 and 32 are provided at both outer sides in the above one direction of a region in which parts of the teeth of the first electrode 21 and the second electrode 22 are provided. Furthermore, a common electrode 40 is provided at a surface of the opposite surface to the surface of the ferroelectric layer 10 in which the first electrode 21 and the second electrode 22 are provided. In so doing, it is possible to apply a voltage between the common electrode 40, the first electrode 21 and the second electrode 22.

Here, examples of the ferroelectric layer 10 include, for example, lead titanate ($PbTiO_3$), lead zirconate titanate ($Pb(Zr, Ti)O_3$), barium titanate ($BaTiO_3$), lithium niobate ($LiNbO_3$), lithium tantalate ($LiTaO_3$), sodium niobate ($NaNbO_3$), sodium tantalate ($NaTaO_3$), potassium niobate ($KNbO_3$), potassium tantalate ($KTaO_3$), bismuth sodium titantate (($Bi_{1/2}Na_{1/2}$)$TiO_3$), bismuth potassium tantalate (($Bi_{1/2}K_{1/2}$)$TiO_3$), bismuth ferrate ($BiFeO_3$), strontium bismuth tantalate ($SrBi_2Ta_2O_9$), strontium bismuth niobate ($SrBi_2Nb_2O_9$), or bismuth titanate ($Bi_4Ti_3O_{12}$) and solid solutions having at least one thereof as a component; however, there is no limitation on the material if the material is ferroelectric, and it is possible to use an organic ferroelectric material, such as polyvinylidene fluoride (PVDF), or copolymers (P (VDF/TrFE)) of vinylidene fluoride (VDF) and trifluoroethylene (TrFE). Examples of the method of forming the ferroelectric layer 10 include a method of sintering by forming a raw material powder or a raw material solution in a desired shape, and a method of growing and cutting away a single crystal or a polycrystalline substrate; however, there is no limitation to the above methods if a massive ferroelectric layer 10 is obtained. In addition, the thickness of the ferroelectric layer 10 may be extremely thin because only the vicinity of the surface is polarized as described later; however, it is not problematic if the thickness is of any extent in order that mechanical strength as a structure be maintained. It is preferable that the flatness of the surface of the ferroelectric layer 10 on which the electrodes are arranged be as flat as possible; however, it is not problematic for there to be some surface roughness if in a range in which the electrodes have conductivity. It is preferable that a ferroelectric layer be used that is aligned in a predetermined direction, for example, aligned to the (100) surface.

Examples of the material of the first electrode 21 and the second electrode 22, the lead-out electrodes 31 and 32 and the common electrode 40 include metal elements, such as platinum (Pt), iridium (Ir), gold (Au), aluminum (Al), copper (Cu), titanium (Ti), and stainless steel; tin oxide-based conductive materials, such as indium tin oxide (ITO), and fluorine-doped tin oxide (FTO); zinc oxide-based conductive materials, conductive oxides, such as strontium ruthenate ($SrRuO_3$), lanthanum nickelate ($LaNiO_3$), element doped strontium titanate; and conductive polymers; however, there is not particular limitation thereto, if the material has conductivity. Examples of the method of forming the first electrode 21 and the second electrode 22, as well as the lead-out electrodes 31 and 32 include, gas phase methods, such as a CVD method, liquid phase methods, such as a coating method, solid phase methods, such as a sputtering method, and printing methods; however, the method is not limited thereto. The thickness of the first electrode 21 and the second electrode 22, the lead-out electrodes 31 and 32, and the common electrode 40 is not limited, if within a range able to exhibit conductivity. Although the first electrode 21 and the second electrode 22, the lead-out electrodes 31 and 32, and the common electrode 40 are preferably formed from the same material, it goes without saying that the materials may also be different.

The photoelectric conversion element 1 according to the present embodiment first performs a polarization treatment of the ferroelectric layer 10. FIG. 2 shows a schematic drawing of the polarization treatment of the ferroelectric layer 10.

Polarization treatment is performed by applying a voltage of a coercive voltage or higher obtained from the thickness of the ferroelectric layer 10 and a coercive electric field of the ferroelectric material between the first electrode 21 and the second electrode 22, and the common electrode 40. In so doing, as shown by the arrow in FIG. 2, polarization is performed to be in alternately differing directions in the region between the teeth of the first electrode 21 and the second electrode 22, and the common electrode. The polarization is formed in the region between the teeth of the first electrode 21 and the second electrode 22, and the common electrode of the ferroelectric layer 10, and the polarization direction becomes parallel to the thickness direction of the ferroelectric layer 10. A wall portion that is a polarization boundary is formed in the region between the first electrode 21 and the second electrode 22, and the common electrode 40. The method of voltage application is not particularly limited if a method in which a domain structure as described above is formed; however, a voltage may be sequentially applied to the first electrode 21 and the second electrode 22, or the voltage may be applied at the same time.

By performing the polarization treatment, a domain structure is reliably formed on the ferroelectric layer 10, and, in so doing, the ferroelectric layer functions as a photoelectric conversion element. Although the polarization treatment may be performed only at first, the treatment may also be performed for each predetermined time period.

In order to easily perform the polarization treatment, it is more preferable that the gap between the comb teeth of the first electrode 21 and the second electrode 22 be narrow. In addition, because a portion of the function is impaired when a number of regions that are not polarized (corresponding to the wall portion) are present, it is more preferable that the width of the comb teeth of the first electrode 21 and the second electrode 22 (electrode width) be narrow.

The photoelectric conversion element 1 subjected to polarization treatment in this way generates electric power when irradiated with light. The light for power generation is preferably irradiated from a surface of the ferroelectric layer 10 in which the first electrode 21 and the second electrode 22 are not arranged in cases in which the material of the first electrode 21 and the second electrode 22 reflects or absorbs light, particularly visible light, that is the target. In a case in which the first electrode 21 and the second electrode 22 neither reflect nor absorb light that is the target, light may be irradiated from any surface.

The electric power generated by light being irradiated is extracted through wirings by the lead-out electrodes 31 and 32, and it is possible to transmit an external load.

Embodiment 2

Figure 3:
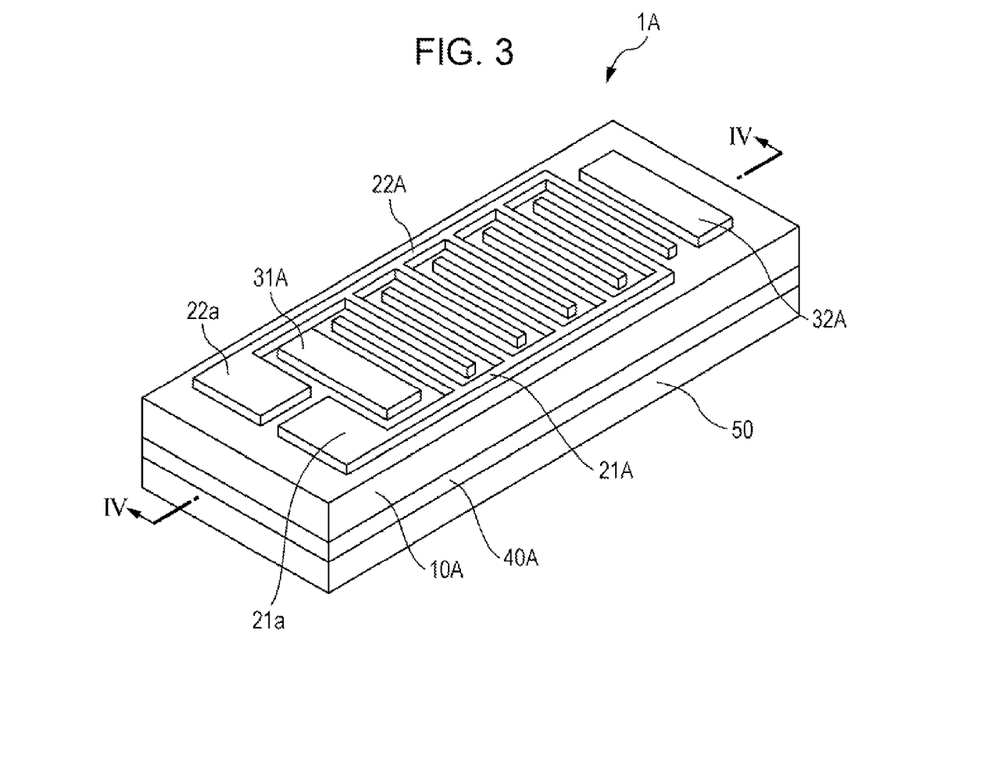
FIG. 3 is a diagram showing a schematic configuration of a photoelectric conversion element according to Embodiment 2 of the invention.
Figure 4:
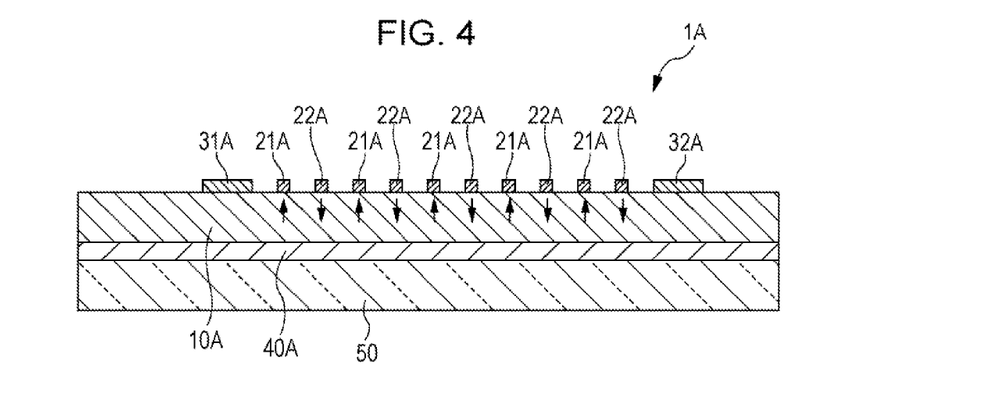
FIG. 4 is a cross-sectional view taken along the line IV-IV of FIG. 3.

FIG. 3 is a diagram showing a schematic configuration of a photoelectric conversion element 1A according to the present embodiment, and FIG. 4 is a cross-sectional view taken along line IV-IV in FIG. 3.

In the present embodiment, the common electrode 40A and the ferroelectric layer 10A are formed on the base 50.

Examples of the base 50 include, for example, various glass materials, transparent ceramic materials such as quartz or sapphire, polymer materials, such as polyimides, semiconductor materials, such as Si, and various other compounds such as SiC; however, there is no limitation to these materials if the material satisfies the conditions described later.

It is possible for the ferroelectric layer 10A, the first electrode 21A and the second electrode 22A, the lead-out electrodes 31A and 32A, and the common electrode 40A to use the same materials and conditions as Embodiment 1. Here, it is possible to use thin film forming methods such as gas phase methods, such as a CVD method, liquid phase methods, such as a coating method, solid phase methods, such as a sputtering method, and printing methods as the method of forming ferroelectric layer 10A, in addition to a method of adhering the above-described massive ferroelectric layer to the base 50.

In the present embodiment, since the first electrode 21A and the second electrode 22A, the common electrode 40A, and the base 50 are arranged on different surfaces of the ferroelectric layer 10A, it is preferable that at least one thereof be a material with a larger band gap than the ferroelectric material used in the ferroelectric layer 10A. It is possible to efficiently incorporate light into the ferroelectric layer by using such a material. For example, if the ferroelectric material is $BiFeO_3$ (band gap=2.6 eV), and if the base 50 is Si (band gap=1.1 eV), it is preferable that the material of the first electrode 21A and the second electrode 22A be a conductive oxide material (band gap>3.2 eV), whereas if the material of the first electrode 21A and the second electrode 22A is a metal (no band gap), it is preferable that the material of the base 50 be a material such as a polymer, a glass or quartz (band gap>7.8 eV).

The polarization treatment and power generation of the photoelectric conversion element 1A of the present embodiment are the same as the above-described Embodiment 1.

Embodiment 3

Figure 5:
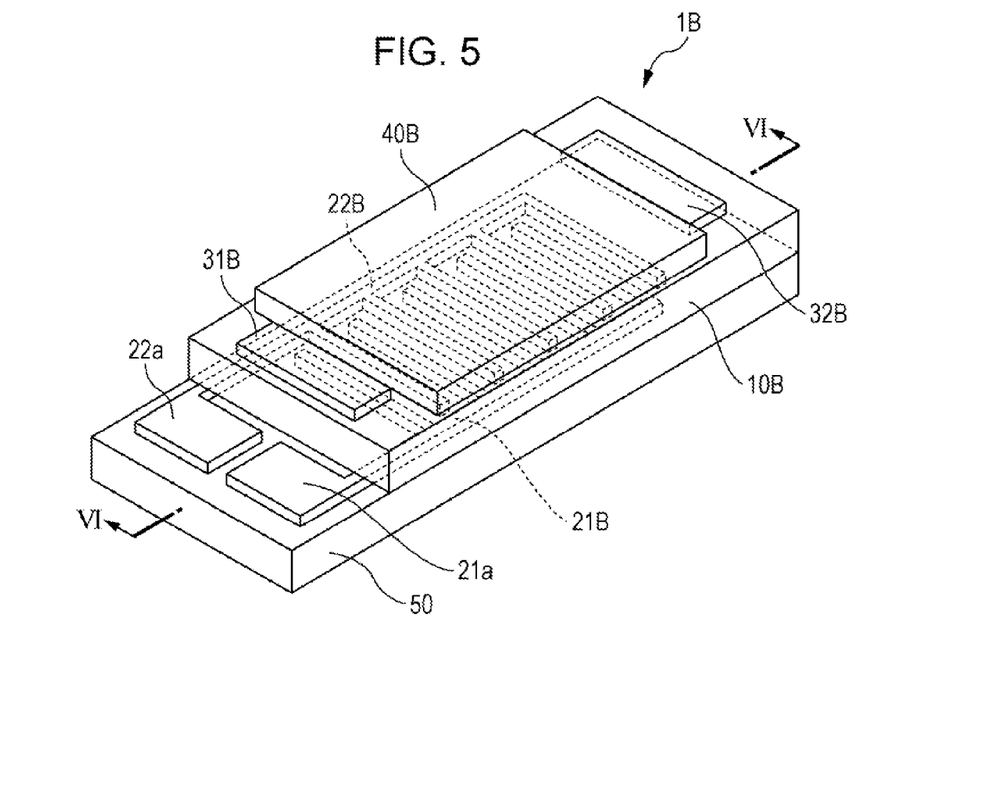
FIG. 5 is a diagram showing a schematic configuration of a photoelectric conversion element according to Embodiment 3 of the invention.
Figure 6:
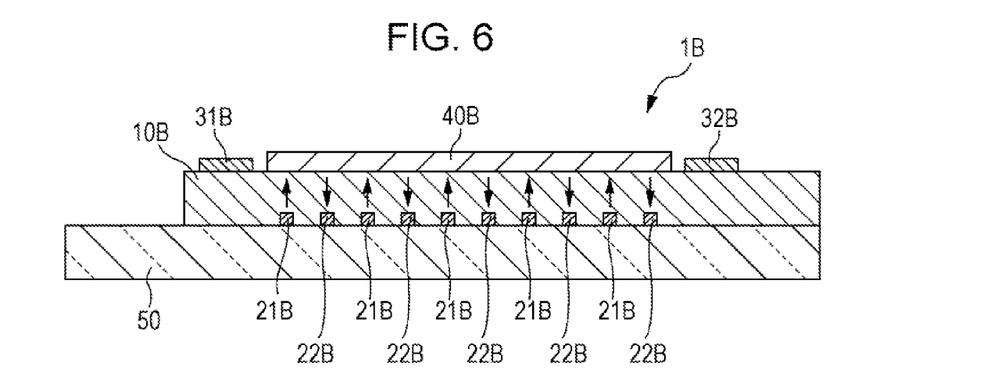
FIG. 6 is a cross-sectional view taken along the line VI-VI of FIG. 5.

FIG. 5 is a diagram showing a schematic configuration of a photoelectric conversion element 1B according to the present embodiment, and FIG. 6 is a cross-sectional view taken along line VI-VI in FIG. 5.

In the photoelectric conversion element 1B according to the embodiment, as shown in FIGS. 5 and 6, the first electrode 21B and the second electrode 22B are formed on a base 50, and a ferroelectric layer 10B is formed thereupon. The power lead-out electrodes 31B and 32B, and the common electrode 40B are arranged on a surface of the opposite side to the surface of the ferroelectric layer 10B that contacts the base 50.

Although the lead-out electrodes 31B and 32B may be provided on the surface of the opposite side to the surface of the ferroelectric layer 10B that contacts the base 50, the lead-out electrodes 31B and 32B may also be provided on the same surface as the first electrode 21B and the second electrode 22B. Although the first electrode 21B and the second electrode 22B may be formed on the base 50 as in the present embodiment, the first electrode 21B and the second electrode 22B may be formed embedded in the base 50.

Although other conditions may be the same as the content described above in Embodiment 2, because a voltage is applied with the polarization treatment is performed, the terminal portions 21a and 22a of the first electrode 21B and the second electrode 22B are provided by being exposed from the ferroelectric layer 10B.

Moreover, because the first electrode 21B and the second electrode 22B, and the base 50 are on the same surface side of the ferroelectric layer 10B in the present embodiment, examples are not constrained to the band gap of the embodiment.

The polarization treatment and power generation of the photoelectric conversion element 1B of the present embodiment are the same as the above-described Embodiments 1 and 2.

Embodiment 4

Figure 7:
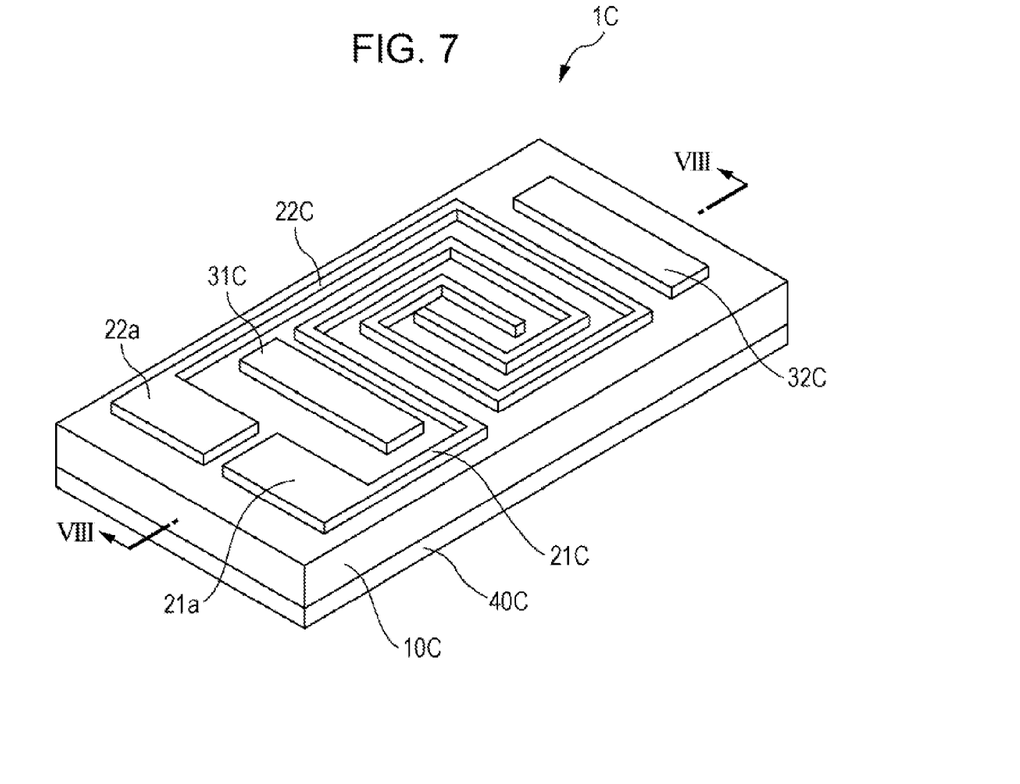
FIG. 7 is a diagram showing a schematic configuration of a photoelectric conversion element according to Embodiment 4 of the invention.
Figure 8:
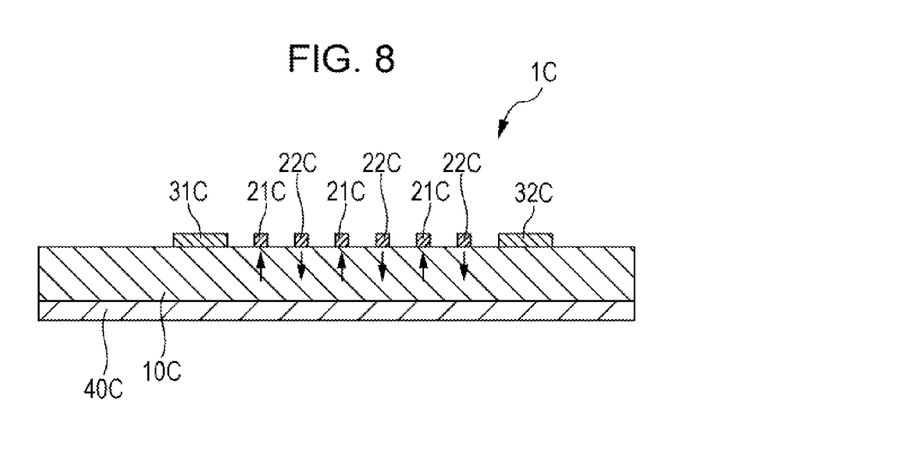
FIG. 8 is a cross-sectional view taken along line VIII-VIII in FIG. 7.

FIG. 7 is a diagram showing a schematic configuration of a photoelectric conversion element 1C of the present embodiment, and FIG. 8 is a cross-sectional view taken along line VIII-VIII in FIG. 7.

The photoelectric conversion element 1C according to the embodiment is the same as Embodiment 1, other than the common electrode 40C being provided on opposite side to the side having the first electrode 21C and the second electrode 22C formed as spiral rather than interdigitated array electrodes on the ferroelectric layer 10C, as shown in FIGS. 7 and 8. Although the power lead-out electrodes 31C and 32C are provided at both ends of the ferroelectric layer 10C in one direction, the lead-out electrodes may be provided at both ends in a direction that intersects thereto, or may be provided in both directions.

The polarization treatment and power generation of the photoelectric conversion element 1C of the present embodiment are the same as the above-described Embodiments 1 to 3. It goes without saying that the structure of the spiral electrodes of the present embodiment may be provided instead of the interdigitated array electrodes of Embodiments 2 and 3.

EXAMPLE

A thin film of a $BiFeO_3$-based ferroelectric material was formed on an Si substrate on which the PT common electrode is formed, and a photoelectric conversion element in which the ITO interdigitated array electrodes and the power lead-out electrodes are formed was prepared.

First, a 1070 nm-thick silicon oxide ($SiO_2$) film was formed on the surface of a (110) single crystal silicon (Si) substrate by thermal oxidation. Next, a 20 nm-thick titanium film was formed on the $SiO_2$ film by the RF magnetron sputtering method, and a 40 nm-thick titanium oxide film was formed by thermal oxidation at 700° C. Next, a common electrode was prepared by forming 130 nm-thick platinum film oriented in the (111) plane by the DC sputtering method on the titanium oxide film.

Thereafter, a thin film of a $BiFeO_3$-based ferroelectric material was formed by a spin coating method. A solution was synthesized by mixing 2-ethyl hexanoic acid in a ligand and various solutions of Bi, La, Fe and Mn in which n-octane is used as a solvent at a ratio of the amount of substance of 80:20:95:5. Next, the synthesized solution was coated on a glass substrate, on which an ITO interdigitated array electrode pattern is formed, at 2,000 rpm with a spin coating method and heated for two minutes at 350° C. after heating for two minutes at 150° C. After this process was repeated three times, heating was performed for five minutes at 650° C. using an RTA. By repeating the above process three times, a 650 nm-thick $BiFeO_3$-based thin film composed of a total of nine layers was prepared.

Next, a interdigitated array electrode and electrode for extracting electric power pattern was formed with a resist on the $BiFeO_3$-based thin film, and ITO electrodes and power lead-out electrodes were formed by removing the resist after the ITO interdigitated array electrodes were formed by an RF sputtering method. The interdigitated array electrodes are formed by a combination of two types of 120 μm and 50 μm, and 70 μm and 100 μm as combinations of the electrode width and the electrode gap.

Figure 9:
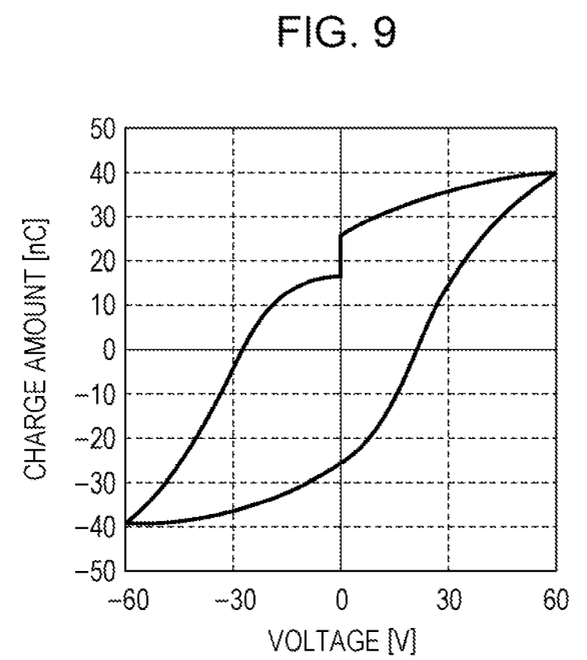
FIG. 9 is a diagram showing the results of a polarization treatment.

A polarization treatment was performed with respect to the prepared element with a 60 V, 1 kHz triangular wave. FIG. 9 shows the results of a polarization treatment. Performance of the polarization treatment was verified.

The entire disclosure of Japanese Patent Application No. 2013-067943, filed Mar. 28, 2013 is incorporated by reference herein.

What is claimed is:

1. A photoelectric conversion element comprising:
   a ferroelectric layer having a first end and a second end;
   a first electrode and a second electrode provided on a surface or a surface layer portion of the ferroelectric layer, each of the first electrode and the second electrode including a plurality of portions, each of the first electrode and the second electrode having terminal ends, one of the terminal ends of the first electrode being adjacent to one of the terminal ends of the second electrode towards the first end of the ferroelectric layer;
   a common electrode provided on a surface or a surface layer portion of an opposite side to a side of the ferroelectric layer on which the first electrode and the second electrode are provided; and
   a pair of lead-out electrodes extracting electric power from the ferroelectric layer,
   wherein the portions of each of the first electrode and the second electrode being arranged alternately in a predetermined direction from the first end toward the second end;
   wherein one of the pair of lead-out electrodes is disposed between the terminal end of each of the first electrode and the second electrode and a portion of the plurality of portions of either the first electrode or the second electrode; and
   wherein the other of the pair of lead-out electrodes being disposed adjacent a portion of the plurality of the portions of the other of the first electrode and the second electrode towards the second end and beyond a terminal end of the other of the first electrode and the second electrode towards the second end of the ferroelectric layer.

2. The photoelectric conversion element according to claim 1, wherein the first electrode and the second electrode are interdigitated array electrodes or spiral electrodes.

3. The photoelectric conversion element according to claim 1, wherein the lead-out electrodes are arranged on the outside of a region in which the first electrode and the second electrode are provided.

4. The photoelectric conversion element according to claim 1, wherein at least one of the first electrode and the second electrode, and the common electrode has a larger band gap than the ferroelectric layer.

5. The photoelectric conversion element according to claim 1, wherein the ferroelectric layer is formed on a base.

6. The photoelectric conversion element according to claim 5, wherein the entire base or a surface thereof serves as the common electrode by having conductivity,
   the ferroelectric layer is formed on the base, and
   the first electrode and the second electrode are formed on an upper surface of the ferroelectric layer.

7. The photoelectric conversion element according to claim 5, wherein the common electrode is formed on the base,
   the ferroelectric layer is formed on the common electrode, and
   the first electrode and the second electrode are formed on an upper surface of the ferroelectric layer.

8. The photoelectric conversion element according to claim 6, wherein at least one of the first electrode and the second electrode, and the base and the common electrode has a larger band gap than the ferroelectric layer.

9. The photoelectric conversion element according to claim 5, wherein the first electrode and the second electrode are formed on the base,
   the ferroelectric layer is formed on the base, the first electrode and the second electrode, and
   the common electrode is formed on the ferroelectric layer.

10. The photoelectric conversion element according to claim 9, wherein at least one of the first electrode and the second electrode, and the common electrode has a larger band gap than the ferroelectric layer.

11. A photovoltaic cell comprising the photoelectric conversion element according to claim 1.

* * * * *